(12) United States Patent
Kim et al.

(10) Patent No.: US 11,686,892 B2
(45) Date of Patent: Jun. 27, 2023

(54) COMBINATION STRUCTURES AND OPTICAL FILTERS AND IMAGE SENSORS AND CAMERA MODULES AND ELECTRONIC DEVICES

(71) Applicant: Samsung Electronics Co., Ltd., Suwon-si (KR)

(72) Inventors: Mi Jeong Kim, Hwaseong-si (KR); Sookyoung Roh, Hwaseong-si (KR); Seokho Yun, Hwaseong-si (KR); Ilhwan Kim, Yongin-si (KR); Hyung Jun Kim, Suwon-si (KR); Chung Kun Cho, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 511 days.

(21) Appl. No.: 16/780,149

(22) Filed: Feb. 3, 2020

(65) Prior Publication Data
US 2020/0379152 A1 Dec. 3, 2020

(30) Foreign Application Priority Data
May 31, 2019 (KR) .................. 10-2019-0064346

(51) Int. Cl.
*G02B 5/22* (2006.01)
*G02B 5/28* (2006.01)
(Continued)

(52) U.S. Cl.
CPC ............. *G02B 5/281* (2013.01); *G02B 5/003* (2013.01); *B82Y 20/00* (2013.01)

(58) Field of Classification Search
CPC ........ G02B 5/281; G02B 5/003; G02B 1/002; G02B 5/207; G02B 5/201; G02B 5/208;
(Continued)

(56) References Cited

U.S. PATENT DOCUMENTS 9,335,217 B2   5/2016  Pisano et al.
10,408,979 B2  9/2019  Yoshioka et al.
(Continued)

FOREIGN PATENT DOCUMENTS

JP        3102496 B2    10/2000
JP     2008181097 A     8/2008
(Continued)

OTHER PUBLICATIONS

Extended European Search Report dated Oct. 30, 2020 for corresponding European Patent Application No. 20163826.9.
(Continued)

*Primary Examiner* — Balram T Parbadia
(74) *Attorney, Agent, or Firm* — Harness, Dickey & Pierce, P.L.C.

(57) ABSTRACT

Disclosed are a combination structure including a nanostructure array including a plurality of nanostructures with a smaller dimension than the near-infrared wavelength are repeatedly arranged and a light absorption portion adjacent to the nanostructure array and including a near-infrared absorbing material configured to absorb light in at least a portion of near-infrared wavelength regions, an optical filter, an image sensor, a camera module, and an electronic device including the same.

28 Claims, 25 Drawing Sheets

(51) Int. Cl.
*G02B 5/00* (2006.01)
*B82Y 20/00* (2011.01)

(58) Field of Classification Search
CPC ... G02B 5/22; G02B 1/00; G02B 5/00; G02B 5/28; B82Y 20/00; H01L 27/14625; H01L 27/14601; H01L 27/14621; H01L 27/14643; H01L 27/146; H04N 5/335; B28Y 20/00
See application file for complete search history.

(56) References Cited

U.S. PATENT DOCUMENTS

| | | | | |
|---|---|---|---|---|
| 2009/0250594 | A1* | 10/2009 | Tanaka | H01L 27/14685 438/70 |
| 2011/0128423 | A1 | 6/2011 | Lee et al. | |
| 2012/0161090 | A1 | 6/2012 | Zhu et al. | |
| 2012/0287362 | A1* | 11/2012 | Hashimura | B82Y 20/00 359/462 |
| 2015/0035110 | A1* | 2/2015 | Pisano | H01L 27/14683 438/54 |
| 2015/0214261 | A1 | 7/2015 | Park et al. | |
| 2016/0071894 | A1* | 3/2016 | Lee | H01L 27/14627 348/222.1 |
| 2016/0195651 | A1* | 7/2016 | Yoshioka | B32B 7/00 359/359 |
| 2017/0287981 | A1* | 10/2017 | Han | H01L 27/14621 |
| 2017/0363959 | A1 | 12/2017 | Takahashi et al. | |
| 2018/0158856 | A1 | 6/2018 | Han et al. | |
| 2018/0166592 | A1* | 6/2018 | Tseng | H01L 31/02162 |
| 2018/0166952 | A1 | 6/2018 | Guigou et al. | |

FOREIGN PATENT DOCUMENTS

| | | |
|---|---|---|
| JP | 2009227860 A | 10/2009 |
| JP | 2016528498 A | 9/2016 |
| JP | 2016204536 A | 12/2016 |
| KR | 20120022815 A | 3/2012 |
| KR | 20120078435 A | 7/2012 |
| KR | 20160032038 A | 3/2016 |
| KR | 20160032048 A | 3/2016 |
| KR | 20170023160 A | 3/2017 |
| KR | 20170120654 A | 10/2017 |
| WO | WO-2014/028380 A2 | 2/2014 |
| WO | WO-2014/028380 A3 | 5/2014 |

OTHER PUBLICATIONS

Spinelli, Pierpaolo et al. "Light Trapping in Thin Crystalline Si Solar Cells Using Surface Mie Scatterers", IEEE Journal of Photovoltaics, vol. 4. No. 2, Mar. 2014. 554-9.

* cited by examiner

COMBINATION STRUCTURES AND OPTICAL FILTERS AND IMAGE SENSORS AND CAMERA MODULES AND ELECTRONIC DEVICES

CROSS-REFERENCE TO RELATED APPLICATION

This application claims priority to and the benefit of Korean Patent Application No. 10-2019-0064346 filed in the Korean Intellectual Property Office on May 31, 2019, the entire contents of which are incorporated herein by reference.

BACKGROUND

1. Field

Combination structures, optical filters, image sensors, camera modules, and electronic devices are disclosed.

2. Description of the Related Art

Electronic devices including image sensors that store an image as an electrical signal, such as a cell phone, a digital camera, a camcorder, or a camera, have been used.

These electronic devices may include an optical filter in order to reduce or prevent an optical distortion by light in the other regions than a visible wavelength region.

SUMMARY

Example embodiments provide a combination structure capable of achieving desired optical properties for light except for visible wavelength regions with a thin thickness.

Some example embodiments provide an optical filter including the combination structure.

Some example embodiments provide an image sensor including the combination structure and/or the optical filter.

Some example embodiments provide a camera module including the combination structure and/or the optical filter.

Some example embodiments provide an electronic device including the combination structure, the optical filter, the image sensor, and/or the camera module.

According to some example embodiments, a combination structure includes a nanostructure array including a plurality of nanostructures with a smaller dimension than a near-infrared wavelength are repeatedly arranged, and a light absorption portion adjacent to the nanostructure array and including a near-infrared absorbing material configured to absorb light in at least a portion of near-infrared wavelength regions.

The light absorption portion may be disposed at least one of a lower, an upper, and a side of the plurality of nanostructures.

The plurality of nanostructures and the light absorption portion may be in contact with each other.

The near-infrared wavelength may be in a range of greater than about 700 nm and less than or equal to about 1200 nm.

The near-infrared wavelength may be in a range of about 890 nm to about 990 nm.

A width of the nanostructure may be about 100 nm to about 500 nm, and a thickness of the nanostructure may be about 50 nm to about 500 nm.

Each of the nanostructures of the plurality of nanostructures may include a high refractive index material having a refractive index of greater than or equal to about 2.4 at 940 nm.

Each of the nanostructures of the plurality of nanostructures may include a titanium oxide, silicon, aluminum, a III-V semiconductor compound, or a combination thereof.

The near-infrared absorbing material may be configured to absorb light in at least a portion of a wavelength region of greater than about 700 nm and less than or equal to 1200 nm.

A maximum absorption wavelength of the near-infrared absorbing material may be in a range of about 890 nm to about 990 nm.

A refractive index of the light absorption portion may be lower than a refractive index of the nanostructure.

A refractive index of the light absorption portion at 940 nm may be less than or equal to about 1.8.

The near-infrared absorbing material may include a quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, a diquinone compound, a naphthoquinone compound, a squarylium compound, a rylene compound, a perylene compound, a pyrylium compound, a squaraine compound, a thiopyrylium compound, a diketopyrrolopyrrole compound, a boron dipyrromethene compound, a nickel-dithiol complex compound, a croconium compound, a derivative thereof, or a combination thereof.

An optical spectrum of the combination structure may have a maximum absorption wavelength in the wavelength region of greater than about 700 nm and 1200 nm, and a light absorption rate in the maximum absorption wavelength may be greater than about 50%.

The maximum absorption wavelength may be in a range of about 890 nm to about 990 nm.

An optical spectrum of the combination structure may have a minimum transmission wavelength in a wavelength region of greater than about 700 nm and less than or equal to 1200 nm and a transmittance at the minimum transmission wavelength may be less than or equal to about 35%.

The minimum transmission wavelength may be in the range of about 890 nm to about 990 nm.

The combination structure may further include a substrate layer, and a refractive index of the substrate layer may be lower than a refractive index of the nanostructure.

A thickness of the combination structure may be less than or equal to about 1 μm.

According to some example embodiments, an optical filter including the combination structure is provided.

According to some example embodiments, an image sensor includes a semiconductor substrate including a plurality of photodiodes and an optical filter disposed on the semiconductor substrate and configured to block light in at least a portion of near-infrared wavelength regions, wherein the optical filter includes the combination structure.

The image sensor may further include a color filter disposed on the semiconductor substrate and on or under the optical filter.

The image sensor may further include a dual band pass filter configured to transmit all visible wavelength regions and a portion of the near-infrared wavelength region.

According to some example embodiments, a camera module including the optical filter or the image sensor is provided.

According to some example embodiments, an electronic device includes the combination structure, the optical filter, the image sensor, or the camera module.

With a thin thickness, desired optical properties for light except for visible wavelength regions may be effectively realized.

DETAILED DESCRIPTION

Figure 1:
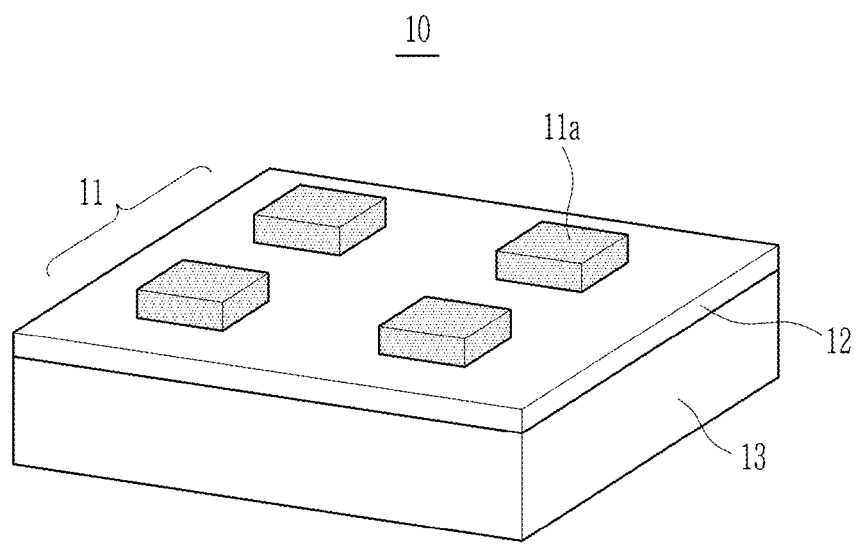
FIG. 1 is a schematic view showing an example of a combination structure according to some example embodiments.

Hereinafter, example embodiments will be described in detail so that a person skilled in the art would understand the same. This disclosure may, however, be embodied in many different forms and is not construed as limited to the example embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Hereinafter, a combination structure according to some example embodiments will be described with reference to drawings.

Figure 2:
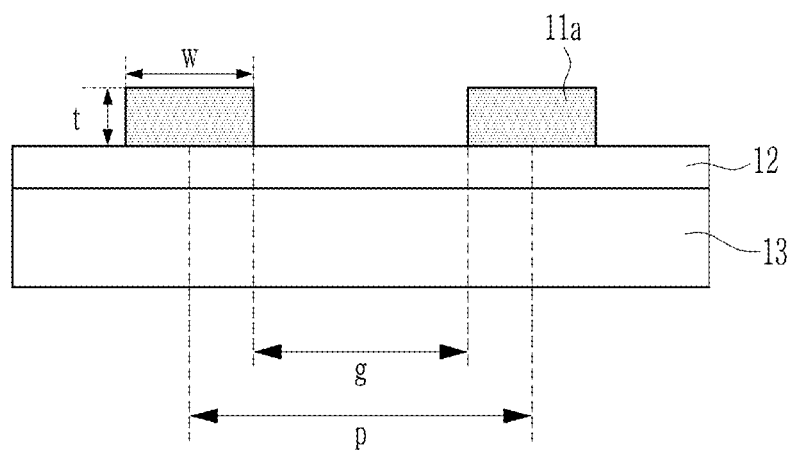
FIG. 2 is a cross-sectional view of the combination structure of FIG. 1.

FIG. 1 is a schematic view showing an example of a combination structure according to some example embodiments, and FIG. 2 is a cross-sectional view of the combination structure of FIG. 1.

A combination structure 10 according to some example embodiments includes a nanostructure array 11, a light absorption portion 12, and a substrate layer 13.

The nanostructure array 11 may be a structure having optical properties called metamaterials or metastructures. The nanostructure array 11 may include a plurality of nanostructures 11a that are arranged repeatedly or periodically, and the plurality of nanostructures 11a may be arranged repeatedly or periodically along a row and/or a column. The plurality of nanostructures 11a may be arranged regularly or randomly. The plurality of nanostructures 11a may be separated from each other or connected to each other.

The nanostructure 11a may be a three dimensional structure having a width (w) and thickness (t), for example, a rectangular parallelepiped shape, a right hexahedral shape, a cylindrical shape, or a disk shape but is not limited thereto. A cross-sectional shape of the nanostructure 11a may be for example a rectangle or a square.

The plurality of nanostructures 11a may be arranged with a period (p) and/or gap (g), wherein the period (p) may be a length between centers of the adjacent nanostructures 11a, and the gap (g) may be a length between facing surfaces of the adjacent nanostructures 11a.

The nanostructure array 11 and/or the nanostructure 11a may be configured to reflect or absorb light of a wavelength and thus exhibit optical properties, for example, reflect or absorb light of a desired wavelength by controlling a shape, geometry, dimension, and/or orientation of the nanostructure 11a and/or an arrangement of the nanostructure array 11. For example, the dimension of the nanostructure 11a may be a subwavelength that is smaller than a wavelength of light for reflection or absorption. Herein, the dimension of the nanostructure 11a may be a width, a thickness, a gap, and/or a period, and when the nanostructure 11a has the cylindrical or disk shape, the width may be a diameter. For example, the dimension of the nanostructure 11a may be a width and a thickness.

For example, the nanostructure array 11 may be configured to reflect or absorb light of a wavelength belonging to a near-infrared wavelength region, wherein the dimension of the nanostructure 11a may be smaller than the wavelength belonging to the near-infrared wavelength region. Herein, the near-infrared wavelength region may be greater than about 700 nm and less than or equal to about 1200 nm, for example about 750 nm to about 1100 nm, about 750 nm to about 1000 nm, about 800 nm to about 1000 nm, about 850 nm to about 990 nm, about 870 nm to about 990 nm, or about 890 nm to about 990 nm.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

For example, the width (w) of the nanostructure 11a may be several nanometers to several hundred nanometers, for example about 100 nm to about 800 nm, about 100 nm to about 500 nm, about 200 nm to about 500 nm, or about 300 nm to about 500 nm.

For example, the thickness (t) of the nanostructure 11a may be several nanometers to several hundred nanometers, for example about 50 nm to about 800 nm, about 50 nm to about 700 nm, about 50 nm to about 600 nm, about 50 nm to about 500 nm, about 100 nm to about 500 nm, about 200 nm to about 500 nm, or about 250 nm to about 500 nm.

For example, the period (p) of the nanostructure 11a may be several nanometers to several hundred nanometers, for example about 200 nm to about 800 nm, about 200 nm to about 700 nm, about 200 nm to about 600 nm, or about 200 nm to about 500 nm.

For example, the gap (g) of the nanostructure 11a may be several tens of nanometers to several hundred nanometers, for example about 50 nm to about 500 nm, about 50 nm to about 400 nm, about 70 nm to about 400 nm, about 70 nm to about 300 nm, or about 80 nm to about 250 nm.

For example, the nanostructure array 11 may be configured to reflect light of a wavelength belonging to a near-infrared wavelength region, and may have, for example a reflectance of greater than or equal to about 80%, greater than or equal to about 82%, greater than or equal to about 85%, greater than or equal to about 88%, greater than or equal to about 90%, greater than or equal to about 92%, greater than or equal to about 95%, greater than or equal to about 97%, greater than or equal to about 99%, or about 100% in a wavelength region of about 700 nm to about 1100 nm. For example, the nanostructure array 11 may be not configured to substantially absorb light of a wavelength belonging to a near-infrared wavelength region, and may for example have an absorption rate of less than or equal to about 5%, less than or equal to about 3%, less than or equal to about 2%, less than or equal to about 1%, less than or equal to about 0.5%, or about 0% in a wavelength region of about 700 nm to about 1100 nm.

The nanostructure 11a may include a high refractive material having a high refractive index. The refractive index may have a wavelength distribution and the nanostructure 11a may include a high refractive material, for example greater than or equal to about 2.0, greater than or equal to about 2.3, greater than or equal to about 2.4, greater than or equal to about 2.5, greater than or equal to about 3.0, greater than or equal to about 3.5, or greater than or equal to about 4.0 at about 900 nm to about 1000 nm (e.g., 940 nm). For example, the nanostructure 11a may have a refractive index of about 2.0 to about 5.0, about 2.3 to about 5.0, about 2.4 to about 5.0, about 2.5 to about 5.0, about 3.0 to about 5.0, about 2.0 to about 4.0, about 2.3 to about 4.0, about 2.4 to about 4.0, about 2.5 to about 4.0, about 3.0 to about 4.0, or about 2.0 to about 3.0. For example, the nanostructure 11a may include an insulator, a conductor, a semiconductor, or a combination thereof having the refractive index, for example an oxide, a nitride, a sulfide, a metal, a semiconductor, a semiconductor compound, or a combination thereof, for example a titanium oxide, a zinc oxide, an indium oxide, a zirconium oxide, silicon, aluminum, a III-V semiconductor compound, or a combination thereof, but is not limited thereto.

The light absorption portion 12 is an area configured to absorb light of a wavelength. The light absorption portion 12 may be disposed adjacent to the nanostructure array 11 and for example may be in contact with the nanostructure array 11. The light absorption portion 12 may be a light-absorbing layer under the plurality of the nanostructures 11a and may be in contact with lower surfaces of the plurality of the nanostructures 11a.

The light absorption portion 12 includes a light-absorbing material configured to absorb light of a wavelength. The light-absorbing material may be one or more, and may be for example an organic material, an inorganic material, organic/inorganic material, or a combination thereof.

For example, the light absorption portion 12 may include a near-infrared absorbing material configured to absorb light in at least a portion of near-infrared wavelength regions. The near-infrared absorbing material may be configured to absorb light in at least a portion of a wavelength region of greater than about 700 nm and less than or equal to 1200 nm and a maximum absorption wavelength ($\lambda_{max,A}$) of the near-infrared absorbing material may for example belong to about 750 nm to about 1100 nm, about 750 nm to about 1000 nm, about 800 nm to about 1000 nm, about 850 nm to about 990 nm, about 870 nm to about 990 nm or about 890 nm to about 990 nm.

The near-infrared absorbing material may be one or more near-infrared absorbing material, and is not particularly limited as long as it is capable of selectively absorbing light in a near-infrared wavelength region. The near-infrared absorbing material may be an organic material, an inorganic material, an organic/inorganic material, and/or a combination thereof.

The near-infrared absorbing material may include for example a quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, a diquinone compound, a naphthoquinone compound, a squarylium compound, a rylene compound, a perylene compound, a pyrylium compound, a squaraine compound, a thiopyrylium compound, a diketopyrrolopyrrole) compound, a boron-dipyrromethene compound, a nickel-dithiol complex compound, a croconium compound, a derivative thereof, or a combination thereof, but is not limited thereto.

For example, the light absorption portion 12 including the near-infrared absorbing material may have a refractive index in a near-infrared wavelength region in a range of less than or equal to about 2.0 or less than or equal to about 1.8, for example, in a range of about 1.1 to about 2.0 or about 1.1 to about 1.8, and the refractive index in a wavelength region of about 900 nm to about 1000 nm (e.g., 940 nm) for example, may be less than or equal to about 2.0 or less than or equal to about 1.8, for example, in a range of about 1.1 to about 2.0 or about 1.1 to about 1.8. For example, the light absorption portion 12 including the near-infrared absorbing material may have an extinction coefficient in the near-infrared wavelength region in a range of about 0.01 to about 0.5, for example, a extinction coefficient in a wavelength region of about 900 nm to about 1000 nm (e.g., about 940 nm) in a range of about 0.01 to about 0.5.

The light absorption portion 12 may be formed from the composition including the aforementioned near-infrared absorbing material, and the light absorption portion 12 may be for example, a curing product of the composition.

The composition may further include a binder, in addition to the aforementioned near-infrared absorbing material. The binder may be an organic binder, an inorganic binder, an organic/inorganic binder, or a combination thereof, and is not particularly limited as long as it is a material capable of blending with the near-infrared absorbing material or dispersing the near-infrared absorbing material, or binding the near-infrared absorbing material. The binder may be a curable binder, for example a thermally curable binder, a photo-curable binder, or a combination thereof.

The binder may be, for example, a (meth)acryl binder, methyl cellulose, ethyl cellulose, hydroxypropyl methyl cellulose (HPMC), hydroxylpropyl cellulose (HPC), xanthan gum, polyvinyl alcohol (PVA), polyvinyl pyrrolidone (PVP), a cyclic olefin polymer (COP), carboxy methyl cellulose, hydroxyl ethyl cellulose, silicone, organic-inorganic hybrid materials, a copolymer thereof, or a combination thereof, but is not limited thereto.

The near-infrared absorbing material may be for example included in an amount of about 0.01 to about 50 parts by weight, about 0.01 to about 30 parts by weight, about 0.01 to about 20 parts by weight, about 0.01 to about 15 parts by weight, or about 0.01 to about 10 parts by weight based on 100 parts by weight of the binder.

The composition may optionally further include a solvent in addition to the aforementioned near-infrared absorbing material and binder.

The composition may be coated and dried on the substrate layer 13 that will be described later, and optionally cured. The coating may be for example a spin coating, a slit coating, a bar coating, a blade coating, a slot die coating, and/or an inkjet coating. The drying may be for example performed by natural drying, hot air drying, and/or a heat treatment at a higher temperature than the boiling point of the aforementioned solvent. The curing may be thermal curing, photo curing, or a combination thereof.

The light absorption portion 12 may have a thickness ranging from about 1 nm to about 1000 nm, for example, about 10 nm to about 1000 nm, about 10 nm to about 700 nm, about 10 nm to about 500 nm, or about 10 nm to about 300 nm.

The substrate layer 13 is disposed under the nanostructure array 11 and the light absorption portion 12 and supports the nanostructure array 11 and the light absorption portion 12. The substrate layer 13 may be a transparent substrate layer and, for example, have transmittance of greater than or equal to about 85% or greater than or equal to about 90% in a wavelength region of about 400 nm to about 1000 nm.

The substrate layer 13 may have a lower refractive index than that of the nanostructure 11a, for example, a refractive index of less than or equal to about 1.7 in a range of about 900 nm to about 1000 nm (e.g., about 940 nm), for example, in a range of about 1.4 to about 1.7. The substrate layer 13 may, for example, include an organic material, an inorganic material, an organic/inorganic material, or a combination thereof, for example, oxide, nitride, sulfide, fluoride, a polymer, or a combination thereof, for example, glass, silicon oxide, aluminum oxide, magnesium fluoride, polystyrene, polymethylmethacrylate, polycarbonate, or a combination thereof but is not limited thereto.

The combination structure 10 may have a thickness of about 10 μm, less than or equal to about 5 μm, less than or equal to about 3 μm, less than or equal to about 2 μm, less than or equal to about 1 μm, less than or equal to about 900 nm, less than or equal to about 800 nm, less than or equal to about 700 nm, less than or equal to about 600 nm, or less than or equal to about 500 nm. For example, the thickness of the combination structure 10 may be in a range of about 100 nm to about 10 μm, about 100 nm to about 5 μm, about 100 nm to about 3 μm, about 100 nm to about 2 μm, about 100 nm to about 1 μm, about 100 nm to about 900 nm, about 100 nm to about 800 nm, about 100 nm to about 700 nm, about 100 nm to about 600 nm, or about 100 nm to about 500 nm.

The combination structure 10 may exhibit high light absorption characteristics with a thin thickness by combining the nanostructure array 11 and the light absorption portion 12. The reason may be based on unique optical properties of the nanostructure array 11 called to be a metamaterial or a metastructure, and the nanostructure array 11 and/or the nanostructure 11a may confine incident light of a wavelength, and the adjacent light absorption portion 12 may be configured to multi-absorb the incident light confined in the nanostructure array 11 and/or the nanostructure 11a and thus exhibit a high light-absorption effect. An absorbed light dose by the multi-absorption may be greatly high compared with an absorbed light dose by a single-absorption in the light absorption portion 12 of a plane structure having no nanostructure array 11.

Figure 3:
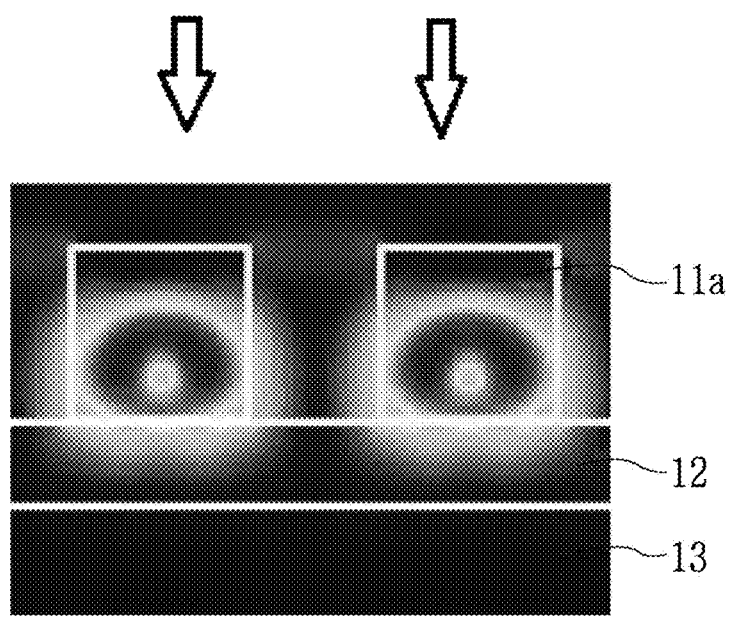
FIG. 3 is a simulation photograph showing a principle of absorption of a combination structure according to some example embodiments.

FIG. 3 is a simulation photograph showing a principle of absorption of a combination structure according to some example embodiments.

Referring to FIG. 3, incident light from the top of the nanostructure 11a having a dimension of a subwavelength may be confined inside the nanostructure 11a, and the confined light inside the nanostructure 11a may be made to flow into the light absorption portion 12 by an evanescent wave and multi-absorbed therein and thus exhibit high light absorption characteristics.

For example, the nanostructure array 11 may be designed to be configured to reflect or absorb light having a wavelength of a near-infrared wavelength region, and the light absorption portion 12 may include a near-infrared absorbing material configured to absorb light in at least a portion of the near-infrared wavelength region, and accordingly, the combination structure 10 may be effectively configured to transmit light in a visible wavelength region and effectively absorb light in the near-infrared wavelength region.

Accordingly, an optical spectrum of the combination structure 10 may have a maximum absorption wavelength ($\lambda_{max,A}$) and a minimum transmission wavelength ($\lambda_{min,T}$) in a wavelength region of greater than about 700 nm and about 1200 nm, and for example, a maximum absorption wavelength ($\lambda_{max,A}$) and a minimum transmission wavelength ($\lambda_{min,T}$) in a range of about 750 nm to about 1100 nm, about 750 nm to about 1000 nm, about 800 nm to about 1000 nm, about 850 nm to about 990 nm, about 870 nm to about 990 nm, or about 890 nm to about 990 nm. The combination structure 10 may have a light absorption rate of greater than or equal to about 50% at a maximum absorption wavelength ($\lambda_{max,A}$) and for example, greater than or equal to about 55%, greater than or equal to about 60%, greater than or equal to about 65%, or greater than or equal to about 70%. Transmittance of the combination structure 10 at the minimum transmission wavelength ($\lambda_{min,T}$) may be less than or equal to about 35% and for example, less than or equal to about 32%, less than or equal to about 30%, less than or equal to about 28%, less than or equal to about 25%, less than or equal to about 22%, less than or equal to about 20%, less than or equal to about 18%, less than or equal to about 15%, less than or equal to about 10%, or less than or equal to about 5%.

Hereinafter, a combination structure according to some example embodiments will be described.

Figure 4:
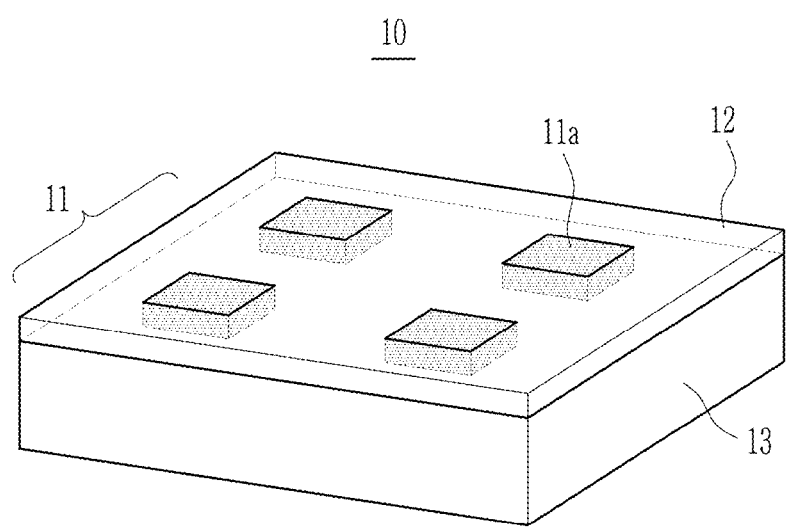
FIG. 4 is a schematic view showing an example of a combination structure according to some example embodiments.
Figure 5:
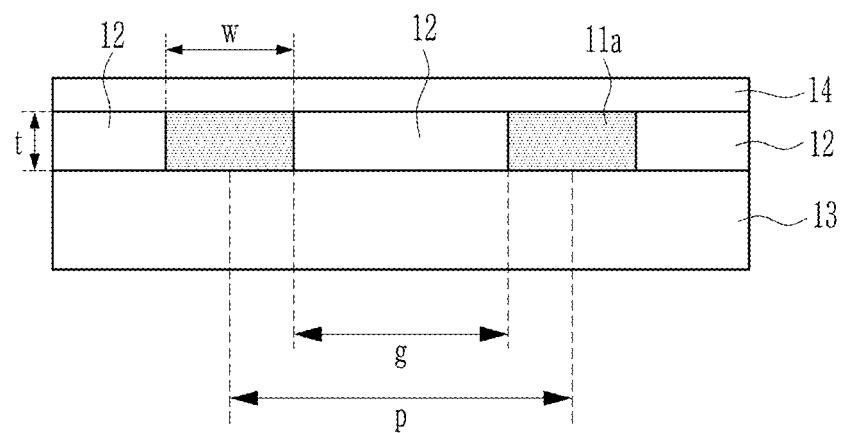
FIG. 5 is a cross-sectional view of the combination structure of FIG. 4.

FIG. 4 is a schematic view showing an example of a combination structure according to some example embodiments, and FIG. 5 is a cross-sectional view of the combination structure of FIG. 4.

According to some example embodiments, a combination structure 10 includes the nanostructure array 11 including the plurality of nanostructures 11a; the light absorption portion 12; and the substrate layer 13, like the aforementioned embodiment.

However, in the combination structure 10 according to some example embodiments, unlike the aforementioned embodiment, the nanostructure array 11 and the light absorption portion 12 are disposed in the same layer. For example, the light absorption portion 12 may be disposed at the side of a plurality of nanostructures 11a, and the light absorption portion 12 may be in contact with a side of the nanostructure 11a.

In addition, the combination structure 10 according to some example embodiments, unlike the aforementioned embodiment, may further include a protective layer 14 on the nanostructure array 11 and the light absorption portion 12. The protective layer 14 may include an organic material, an inorganic material, an organic/inorganic material, or a combination thereof, for example, an oxide, a nitride, a fluoride, a polymer, or a combination thereof, for example glass, a silicon oxide, magnesium fluoride, polystyrene, polymethylmethacrylate, polycarbonate, or a combination thereof, but is not limited thereto. The protective layer 14 may be omitted as needed.

Figure 6:
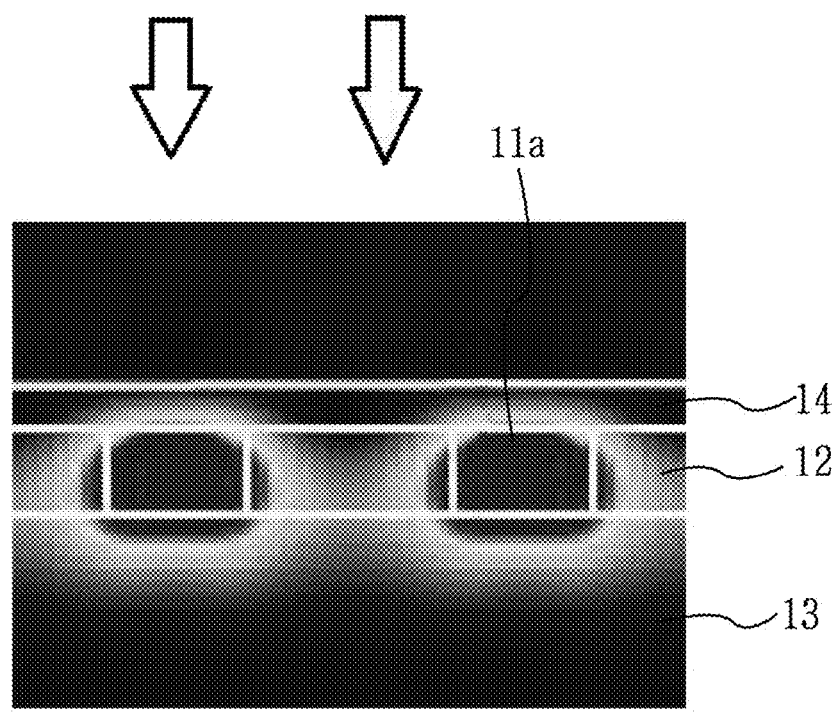
FIG. 6 is a simulation picture showing an absorption principle of the combination structure according to some example embodiments.

FIG. 6 is a simulation picture showing an absorption principle of the combination structure according to some example embodiments.

Referring to FIG. 6, incident light from the top of the nanostructure 11a having a dimension of a subwavelength may be confined with the center of the nanostructure 11a, and the confined light in the nanostructure 11a may be made to flow into the light absorption portion 12 at the side by an evanescent wave and multi-absorbed therein and accordingly, exhibit high light absorption characteristics.

Hereinafter, a combination structure according to some example embodiments is described.

Figure 7:
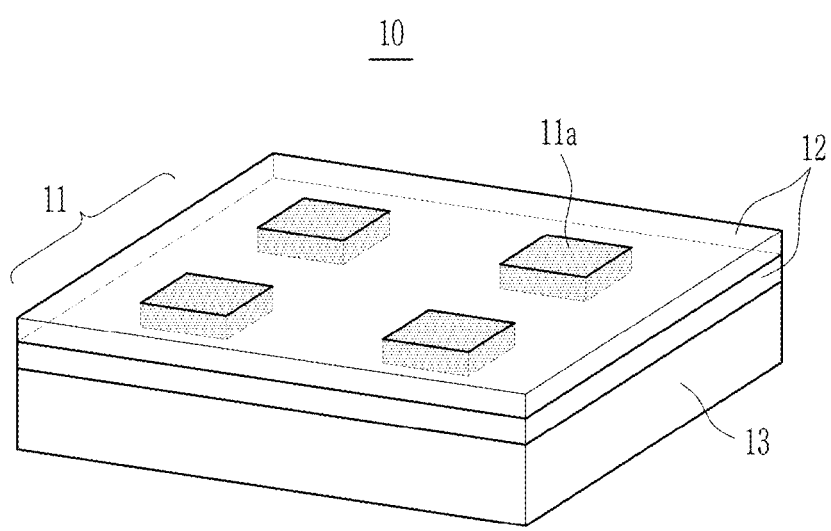
FIG. 7 is a schematic view showing an example of a combination structure according to some example embodiments.
Figure 8:
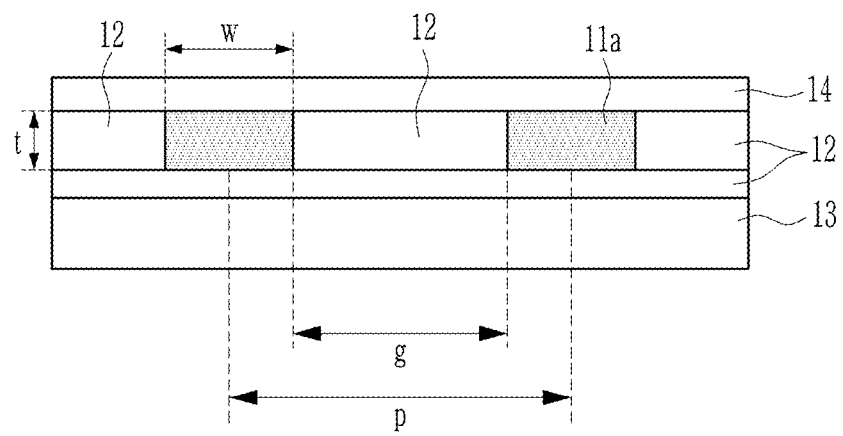
FIG. 8 is a cross-sectional view of the combination structure of FIG. 7.

FIG. 7 is a schematic view showing an example of a combination structure according to some example embodiments and FIG. 8 is a cross-sectional view of the combination structure of FIG. 7.

According to some example embodiments, a combination structure 10 includes the nanostructure array 11 including the plurality of nanostructures 11a; the light absorption portion 12; the substrate layer 13; and optionally the protective layer 14, like the aforementioned embodiment.

However, the combination structure 10 according to some example embodiments, unlike the aforementioned embodiment, may include the light absorption portion 12 disposed under the nanostructure array 11 and in the same layer as the nanostructure array 11. For example, the light absorption portion 12 may be disposed at the side of and under a plurality of nanostructures 11a, and the light absorption portion 12 may respectively contact at the side of and under the nanostructure 11a.

Hereinafter, a combination structure according to some example embodiments is described.

Figure 9:
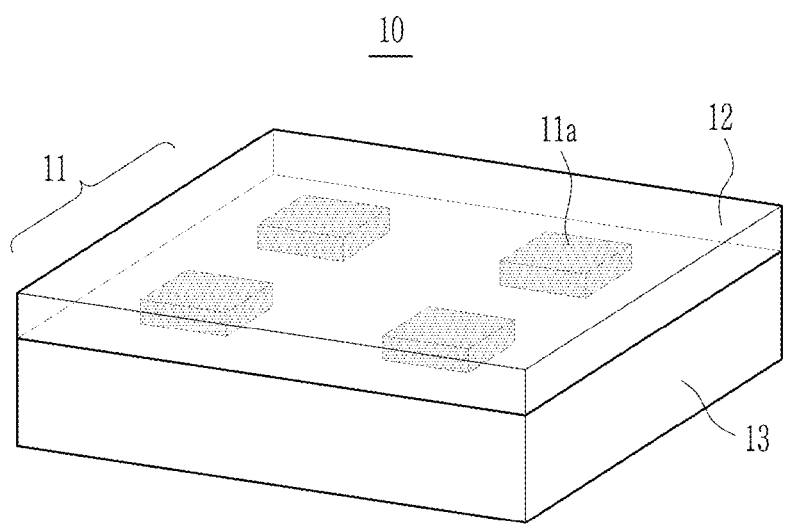
FIG. 9 is a schematic view showing an example of a combination structure according to some example embodiments.
Figure 10:
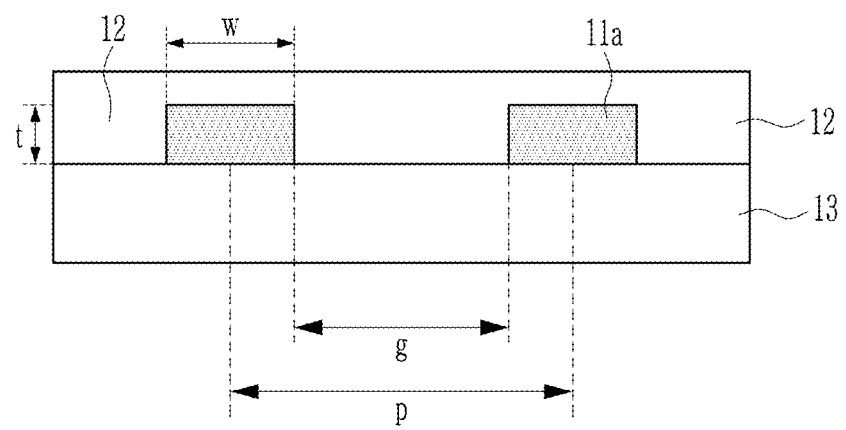
FIG. 10 is a cross-sectional view of the combination structure of FIG. 9.

FIG. 9 is a schematic view showing an example of a combination structure according to some example embodiments, and FIG. 10 is a cross-sectional view of the combination structure of FIG. 9.

According to some example embodiments, a combination structure 10 includes the nanostructure array 11 including the plurality of nanostructures 11a; the light absorption portion 12; and the substrate layer 13, like the aforementioned embodiment.

However, the combination structure 10 according to some example embodiments, unlike the aforementioned embodiment, may include the light absorption portion 12 on the top and at the side of nanostructure array 11. For example, the light absorption portion 12 may respectively contact on and at the side of the nanostructure 11a.

The combination structure 10 may exhibit high light absorption characteristics with a thin thickness by increasing light absorption at a desired wavelength, thereby realizing a thin thickness optical filter. For example, the combination structure 10 configured to selectively absorb in a near-infrared wavelength region may effectively transmit light in a visible wavelength region and effectively absorb light in a near-infrared wavelength region, and thus may be effectively applied as an optical filter configured to block light in the near-infrared wavelength region in a sensor sensing light like an image sensor. In addition, the combination structure 10 may exhibit sufficient light absorption characteristics with a thin thickness and accordingly, may be integrated in the sensor like the image sensor and thus realize an internal optical filter, as described above.

The combination structure 10 may be applied to all applications for filtering light of a wavelength region as an optical filter, and may be effectively applied as a near-infrared cut filter configured to filter light in a near-infrared wavelength region. The optical filter may be usefully applied to an electronic device including for example an image sensor, a camera module, and the like. The electronic device may be a digital camera, a camcorder, a monitoring camera such as CCTV, an in-car camera, a medical camera, a cell phone having a built-in or external camera, a computer having a built-in or external camera, a laptop computer having a built-in or external camera, and the like but is not limited thereto.

Hereinafter, an example of a camera module provided with the aforementioned combination structure 10 will be described.

Figure 11:
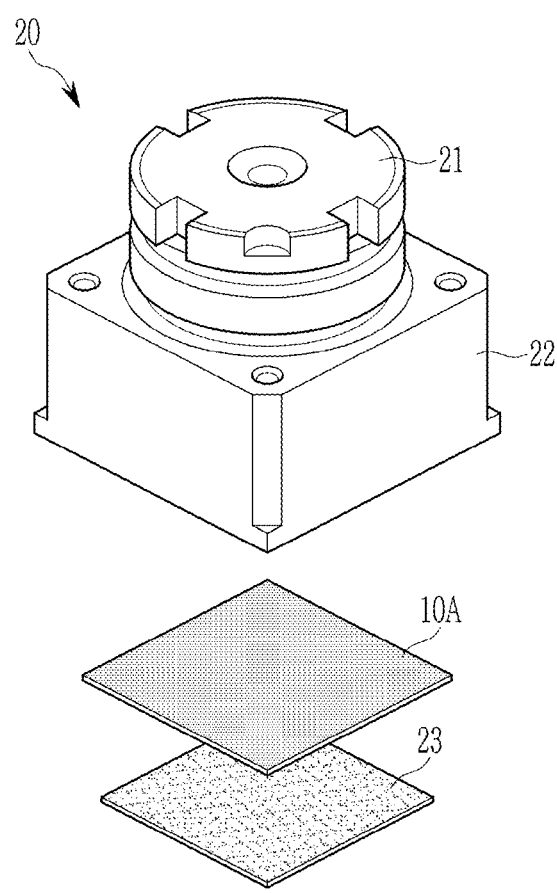
FIG. 11 is a schematic view showing an example of a camera module according to some example embodiments.

FIG. 11 is a schematic view showing an example of a camera module according to some example embodiments.

Referring to FIG. 11, a camera module 20 includes a lens barrel 21, a housing 22, an optical filter 10A, and an image sensor 23.

The lens barrel 21 includes at least one lens imaging a subject, and the lens may be disposed along an optical axis direction. Herein, the optical axis direction may be a vertical direction of the lens barrel 21. The lens barrel 21 is internally housed in the housing 22 and united with the housing 22. The lens barrel 21 may be moved in optical axis direction inside the housing 22 for autofocusing.

The housing 22 supports and houses the lens barrel 21 and may be open in the optical axis direction. Accordingly, incident light from one surface of the housing 22 may reach the image sensor 23 through the lens barrel 21 and the optical filter 10A.

The housing 22 may be equipped with an actuator for moving the lens barrel 21 in the optical axis direction. The actuator may include a voice coil motor (VCM) including a magnet and a coil. However, various methods such as a mechanical driving system or a piezoelectric driving system using a piezoelectric device except for the actuator may be adopted.

The optical filter 10A may include the aforementioned combination structure 10, which is the same as described above.

The image sensor 23 may concentrate an image of a subject and thus store it as data, and the stored data may be displayed as an image through a display media.

The image sensor 23 may be mounted in a substrate (not shown) and electrically connected to the substrate. The substrate may be, for example, a printed circuit board (PCB) or electrically connected to a printed circuit board, and the printed circuit may be, for example, a flexible printed circuit (FPCB).

The image sensor 23 concentrates light passing the lens barrel 21 and the optical filter 10A and generates a video signal and may be a complementary metal-oxide semiconductor (CMOS) image sensor and/or a charge coupled device (CCD) image sensor.

Figure 12:
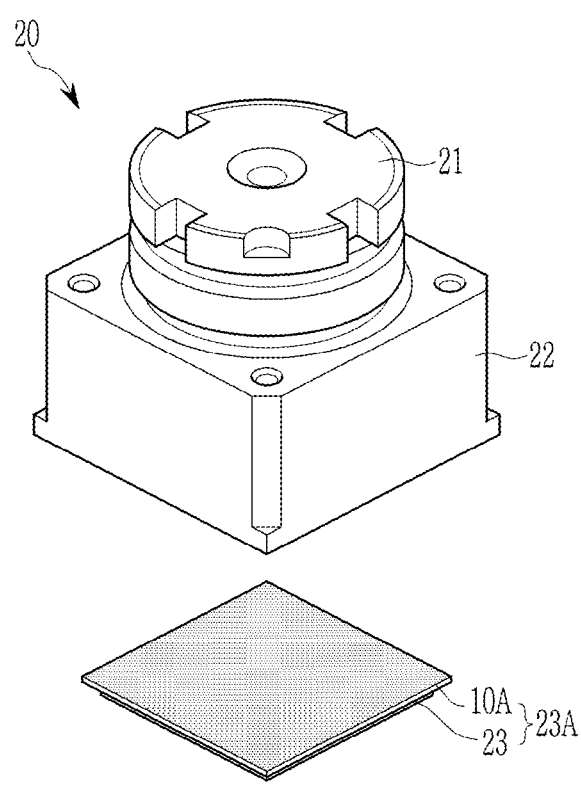
FIG. 12 is a schematic view showing another example of a camera module according to some example embodiments.

FIG. 12 is a schematic view showing another example of a camera module according to some example embodiments.

Referring to FIG. 12, a camera module 20 according to some example embodiments includes the lens barrel 21, the housing 22, the optical filter 10A, and the image sensor 23, like the aforementioned embodiment.

However, in the camera module 20 according to some example embodiments, the optical filter 10A and the image sensor 23 may be in contact with each other, for example the optical filter 10A and the image sensor 23 may be integrally provided, unlike the aforementioned embodiment.

Hereinafter, an example of an optical filter-integrated image sensor will be described with reference to a drawing. As an example of an image sensor, a CMOS image sensor is described.

Figure 13:
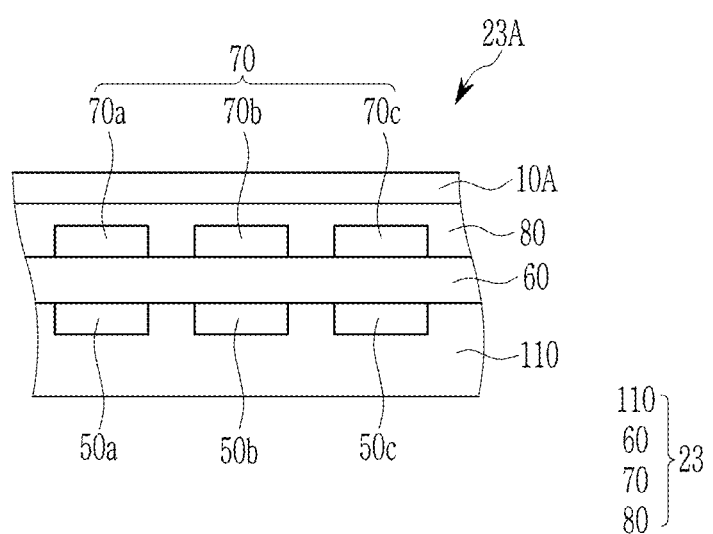
FIG. 13 is a cross-sectional view showing an example of an image sensor according to some example embodiments.

FIG. 13 is a cross-sectional view showing an example of an image sensor according to some example embodiments.

An integrated image sensor 23A according to some example embodiments includes an image sensor 23 including a semiconductor substrate 110, a lower insulation layer 60, a color filter layer 70 and an upper insulation layer 80, and an optical filter 10A.

The semiconductor substrate 110 may be a silicon substrate, and is integrated with the photo-sensing devices 50a, 50b, and 50c, and transmission transistor (not shown). The photo-sensing devices 50a, 50b, and 50c may be photodiodes. For example, the photo-sensing device 50a may be a blue photo-sensing device 50a configured to sense light in a blue wavelength region which passes a blue filter 70a described later, the photo-sensing device 50b may be a green photo-sensing device 50b configured to sense light in a green wavelength region which passes a green filter 70b described later, and the photo-sensing device 50c may be a red photo-sensing device 50c configured to sense light in a red wavelength region passes a red filter 70c described later. The photo-sensing devices 50a, 50b, and 50c and the transmission transistor may be integrated in each pixel. The photo-sensing devices 50a, 50b, and 50c sense light and the sensed information may be transferred by the transmission transistor.

A metal wire (not shown) and a pad (not shown) are formed on the semiconductor substrate 110. In order to decrease signal delay, the metal wire and pad may be made of a metal having low resistivity, for example, aluminum (Al), copper (Cu), silver (Ag), and/or alloys thereof, but is not limited thereto. However, it is not limited to the structure, and the metal wire and pad may be disposed under the photo-sensing devices 50a, 50b, and 50c.

The lower insulation layer 60 is formed on the metal wire and the pad. The lower insulation layer 60 may be made of an inorganic insulating material such as a silicon oxide and/or a silicon nitride, or a low dielectric constant (low K) material such as SiC, SiCOH, SiCO, and SiOF.

A color filter layer 70 is formed on the lower insulation layer 60. The color filter layer 70 includes a blue filter 70a formed in a blue pixel, a green filter 70b formed in a green pixel, and a red filter 70c formed in a red pixel. However, the present disclosure is not limited thereto, for example, at least one of the blue filter 70a, the green filter 70b, and the red filter 70c may be replaced by a yellow filter, a cyan filter, and/or a magenta filter.

The upper insulation layer 80 is formed on the color filter layer 70. The upper insulation layer 80 may provide a flat surface by reducing stepped portions formed by the color filter layer 70. The upper insulation layer 80 may be made of an inorganic insulating material such as silicon oxide and/or silicon nitride or an organic insulating material. The upper insulation layer 80 may be omitted as needed.

The optical filter 10A is formed on the upper insulation layer 80. The optical filter 10A may be the combination structure 10 which includes the nanostructure array 11 including the plurality of nanostructures 11a; the light absorption portion 12; and the substrate layer 13, and may for example block light in a wavelength region except for a visible wavelength region such as a near-infrared wavelength region, as described above. When the upper insulation layer 80 is the same as the substrate layer 13 of the combination structure 10, any one of the upper insulation layer 80 and the substrate layer 13 may be omitted. Specific description of the combination structure 10 is the same as described above.

Focusing lens (not shown) may be further formed on the optical filter 10A. However, the present disclosure is not limited thereto, and the optical filter 10A may be disposed on the focusing lens. The focusing lens may control a direction of incident light and gather the light in one region. The focusing lens may have a shape of, for example, a cylinder or a hemisphere, but is not limited thereto.

A dual bandpass filter (not shown) may be disposed on the focusing lens. The dual bandpass filter may be configured to selectively transmit light in at least two wavelength regions of incident light and may be for example configured to selectively transmit light in a visible wavelength region and in a near-infrared wavelength region.

As described above, the optical filter 10A may be configured to effectively transmit light in the visible wavelength region and be configured to effectively absorb and block light in the other regions like the near-infrared region except for the visible wavelength region and thus transfer pure light in the visible wavelength region to the image sensor and accordingly, reduce or prevent a crosstalk generated when a signal by light of the visible wavelength region is crossed and mingled with another signal by light of a non-visible wavelength region and particularly, the near-infrared wavelength region.

Particularly, the optical filter 10A may have a thin thickness of less than or equal to about 10 μm, less than or equal to about 5 μm, less than or equal to about 3 μm, less than or equal to about 2 μm, or less than or equal to about 1 μm, and thus the optical filter 10A and the image sensor 23 may be realized into an integrated image sensor 23A, and accordingly, may realize thinness of an image sensor, a camera module, and an electronic device equipped therewith.

Figure 14:
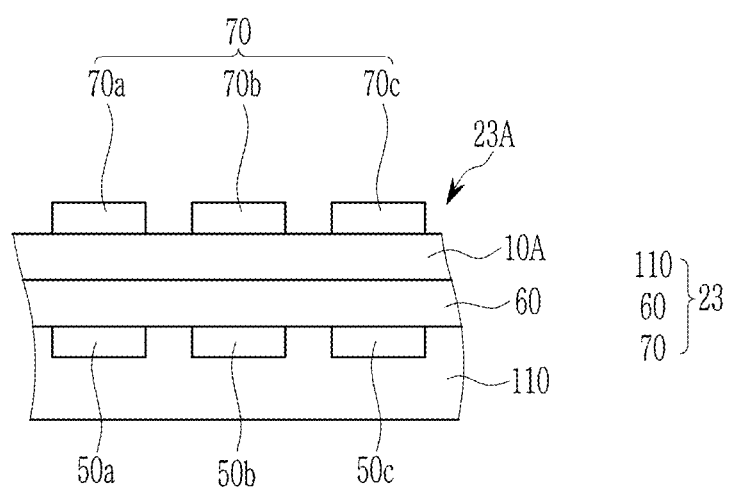
FIG. 14 is a cross-sectional view showing another example of an image sensor according to some example embodiments.

FIG. 14 is a cross-sectional view showing another example of an image sensor according to some example embodiments.

According to some example embodiments, an integrated image sensor 23A includes an image sensor 23 including the semiconductor substrate 110 integrated with photo-sensing devices 50a, 50b, and 50c, the lower insulation layer 60, and the color filter layer 70; and the optical filter 10A, like the aforementioned embodiment.

However, according to some example embodiments, in the integrated image sensor 23A, the optical filter 10A is disposed under the color filter layer 70, unlike the aforementioned embodiment. In the drawing, the optical filter 10A is illustrated as an example with a structure in which the optical filter 10A is disposed between the lower insulation layer 60 and the color filter layer 70. However, the present disclosure is not limited thereto and the optical filter 10A may be disposed between the semiconductor substrate 110 and the lower insulation layer 60.

Figure 15:
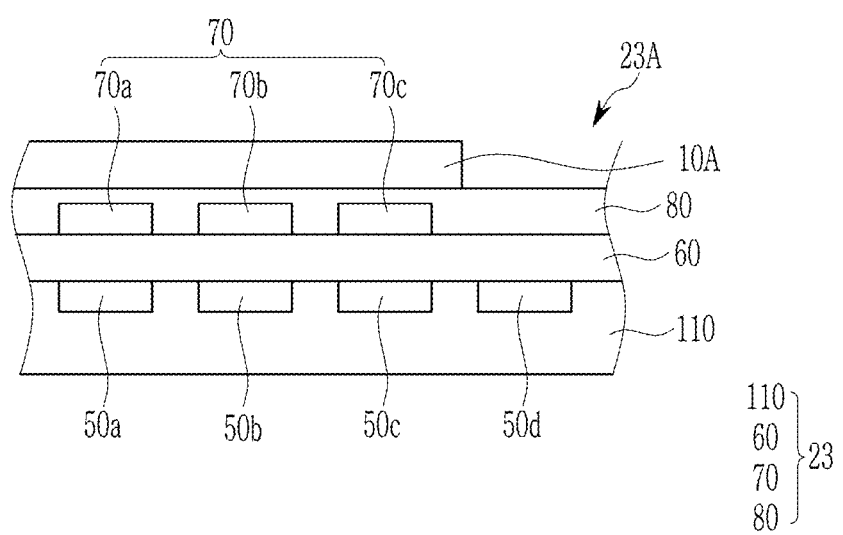
FIG. 15 is a cross-sectional view showing another example of an image sensor according to some example embodiments.

FIG. 15 is a cross-sectional view showing another example of an image sensor according to some example embodiments.

According to some example embodiments, an integrated image sensor 23A includes an image sensor 23 including the semiconductor substrate 110 integrated with photo-sensing device 50a, 50b, and 50c, the lower insulation layer 60, the color filter layer 70, and the upper insulation layer 80, and the optical filter 10A, like the aforementioned embodiment.

However, according to some example embodiments, the integrated image sensor 23A may include the photo-sensing device 50d for sensing light belonging to the infrared wavelength region additionally integrated in the semiconductor substrate 110. The color filter layer 70 may include a transparent filter or a white color filter (not shown) at the position corresponding to the photo-sensing device 50d or just have an empty space without a particular filter.

The optical filter 10A may be disposed only either on or under the blue filter 70a, the green filter 70b, and the red filter 70c but neither on nor under the transparent filter or the white color filter 70d.

The dual bandpass filter may be, for example, configured to selectively transmit light in a visible wavelength region and in a near-infrared wavelength region.

For example, the photo-sensing device 50d may be used as an auxiliary device to improve sensitivity of the image sensor in a low-illumination environment.

For example, the photo-sensing device 50d may be used as an infrared sensor configured to sense light in a near-infrared wavelength region. The infrared sensor may extend a dynamic range specifically classifying a black/white contrast by stages and thus improve visible light image quality and increase sensing capability of a long distance information image. The infrared sensor may be for example a biometric sensor, for example an iris sensor, a depth sensor, a fingerprint sensor, a blood vessel distribution sensor, but is not limited thereto.

Figure 16:
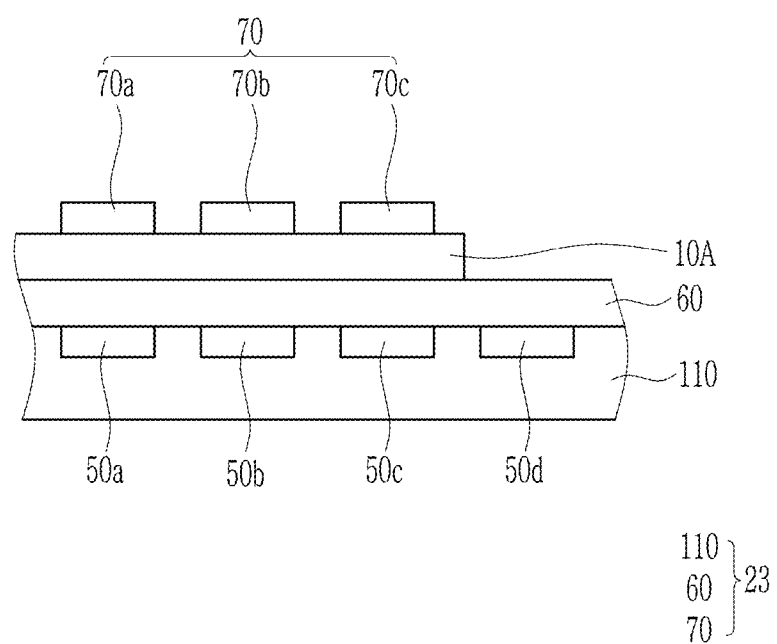
FIG. 16 is a cross-sectional view showing another example of an image sensor according to some example embodiments.

FIG. 16 is a cross-sectional view showing another example of an image sensor according to some example embodiments.

According to some example embodiments, an integrated image sensor 23A includes an image sensor 23 including the semiconductor substrate 110 integrated with photo-sensing devices 50a, 50b, 50c, and 50d, the lower insulation layer 60, and the color filter layer 70; and the optical filter 10A, like the aforementioned embodiment.

However, according to some example embodiments, in the integrated image sensor 23A, the optical filter 10A is disposed under the color filter layer 70. The optical filter 10A may have a structure in which the optical filter 10A is disposed between the lower insulation layer 60 and the color filter layer 70. However, the present disclosure is not limited thereto and the optical filter 10A may be disposed between the semiconductor substrate 110 and the lower insulation layer 60.

Hereinafter, the example embodiments are illustrated in more detail with reference to examples. However, these examples are exemplary, and the present scope is not limited thereto.

Manufacture of Near-Infrared Absorption Film and Evaluation of Properties 0.1 g of a near-infrared absorbing compound (Epolin, Epolight™ 1178), 1 g of a cycloolefin polymer (poly[[octahydro-5-(methoxycarbonyl)-5-methyl-4,7-methano-1H-indene-1,3-diyl]-1,2-ethanediyl], CAS No. 123322-60-1, Sigma-Aldrich Co., Ltd.), and 25 g of chloroform are mixed to prepare a composition, and the composition is spin-coated (3000 rpm, 20 seconds) on a $SiO_2$ substrate to form an about 800 nm-thick near-infrared absorption film.

Properties of the obtained near-infrared absorption film are examined.

Transmittance and absorbance of the film are measured by using a UV-VIS-NIR spectrophotometer (Shimadzu Solid Spec-3700 DUV), and a thickness thereof is measured by using Alpha-Step (D-500 Stylus Profiler, KLA Corp.). The transmittance and the film thickness are used to obtain an extinction coefficient according to the following relationship equation.

$$T(\lambda)=\exp(-\alpha(\lambda)d)=\exp(-4\pi/\lambda \times k(\lambda)d) \quad \text{[Relationship Equation]}$$

In the relationship equation, T ($\lambda$) is a transmittance depending on a wavelength, $\lambda$ is a wavelength (unit nm), k ($\lambda$) is an extinction coefficient depending on a wavelength, and d is a film thickness (unit nm).

A refractive index and the extinction coefficient are obtained from a polarized light characteristic change (Delta, Psi) by using an Ellipsometry equipment (J.A. Woollam Co.). Herein, the extinction coefficient obtained from Ellipsometry accords with the extinction coefficient obtained from Relationship Equation 1.

As a result, an average transmittance is 94.5% in a visible wavelength region of 430 nm to about 680 nm and an average transmittance is 29.8% in a near-infrared wavelength region of 890 nm to about 990 nm, a minimum transmission wavelength ($\lambda_{min,T}$) is 960 nm, a transmittance at the minimum transmission wavelength ($\lambda_{min,T}$) is 27.9%, and an average refractive index (n) is 1.5 (@900 nm to 1000 nm), and an average absorbance (k) is 0.11 (@900 nm to 1000 nm).

Design and Evaluation of Combination Structure I

Based on the properties of the near-infrared absorption film, an optical simulation of the combination structure including the nanostructure array and the light absorption portion is performed using FDTD (Finite-different time domain, Lumerical) software.

Example 1

A structure of stacking a $SiO_2$ substrate layer/a light-absorbing layer (a thickness: 200 nm)/a $TiO_2$ nanostructure array from the bottom is set. The light-absorbing layer is based on properties of the aforementioned near-infrared absorption film.

As for the TiO₂ nanostructure array, a periodic pattern of a TiO₂ nanostructure (a refractive index: 2.5 @940 nm) is set.
  Shape: rectangular parallelepiped
  Shape of cross-section: square
  Width (w): 350 nm,
  Thickness (t): 425 nm,
  Period (p): 600 nm,
  Gap (g): 250 nm Comparative Example 1

The same structure as Example 1 is set except that a stack structure of the SiO₂ substrate layer/the TiO₂ nanostructure array is set without the light-absorbing layer.

Comparative Example 2

The same structure as Example 1 is set except that a stack structure of stacking the SiO₂ substrate layer/the light-absorbing layer (a thickness: 200 nm) is set without the TiO₂ nanostructure array.

Evaluation

Figure 17:
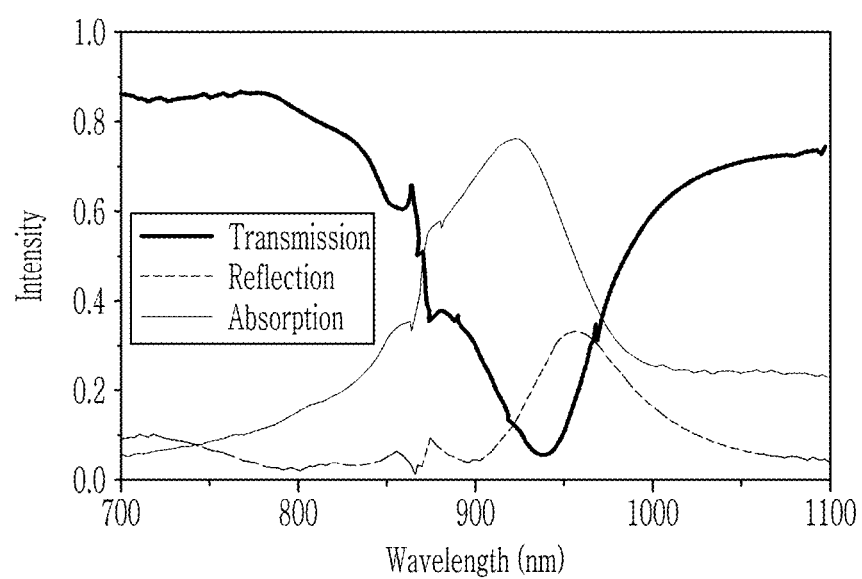
FIG. 17 is an optical spectrum of the structure according to Example 1.

Optical properties of the structures according to Example 1 and Comparative Examples 1 and 2 are evaluated.
The results are shown in Table 1 and FIGS. 17 to 19.
FIG. 17 is an optical spectrum of the structure according to Example 1, FIG. 18 is an optical spectrum of the structure according to Comparative Example 1, and FIG. 19 is an optical spectrum of the structure according to Comparative Example 2.

TABLE 1

|  | Example 1 | Comparative Example 1 | Comparative Example 2 |
|---|---|---|---|
| Light absorption rate (@ 937 nm) (%) | 71 | 0 | 22 |
| Transmittance (@ 937 nm) (%) | 5 | <1 | 75 |
| Reflectance (@ 937 nm) (%) | 24 | >99 | 3 |

Figure 18:
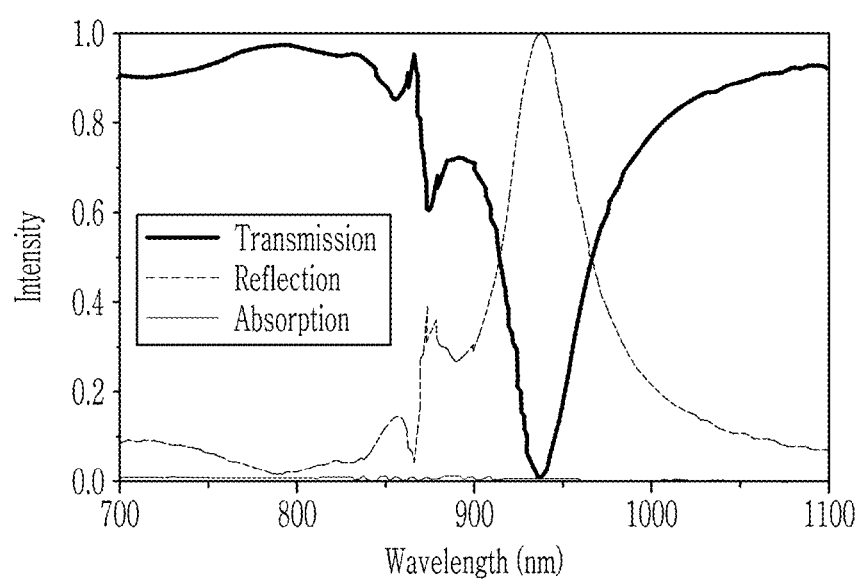
FIG. 18 is an optical spectrum of the structure according to Comparative Example 1.
Figure 19:
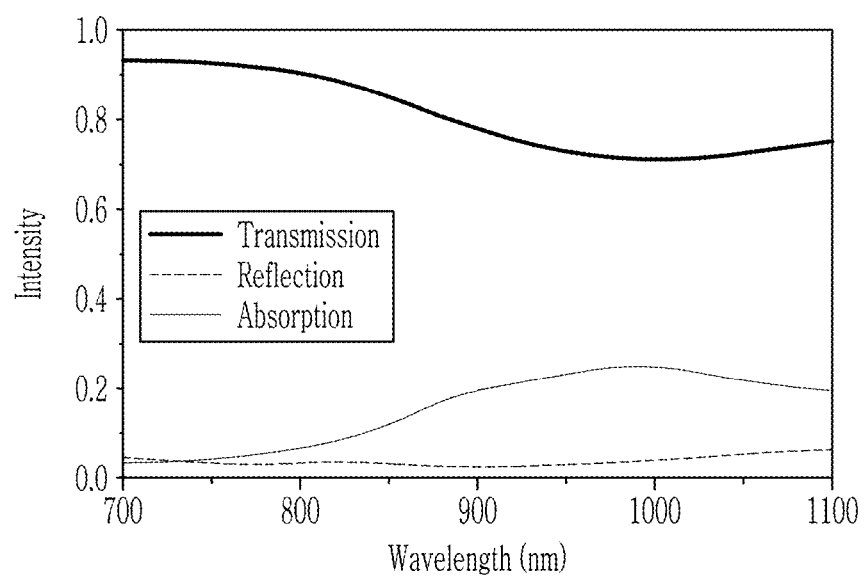
FIG. 19 is an optical spectrum of the structure according to Comparative Example 2.

Referring to Table 1 and FIGS. 17 to 19, the structure according to Example 1 exhibits greatly high light absorption characteristics due to complementary bonding of the nanostructure array and the light-absorbing layer compared with the structures according to Comparative Examples 1 and 2. The structure of Example 1 exhibits a light absorption rate of 71% which is greatly higher than 22% of a light absorption rate sum of the structures of Comparative Examples 1 and 2, and the reason is that new optical phenomenon is generated by not a simple combination of two materials but the complementary bonding of the nanostructure array and the light-absorbing layer called to be a metal structure.

Design and Evaluation of Combination Structure II

The same structure as the above example is set except that a thickness of the TiO₂ nanostructure is changed to 275 nm in the physical properties of the near-infrared absorption film and optical simulation of the combination structure including the nanostructure array and the light absorption portion is performed using FDTD (Finite-different time domain, Lumerical) software.

As shown in the structure of Example 1, when the TiO₂ nanostructure array has a thickness of greater than or equal to 400 nm, etching technology of a high aspect ratio is required in forming the TiO₂ nanostructure array, and accordingly, optical properties of a case that a TiO₂ nanostructure array having a thickness of 275 nm and not requiring the etching technology of a high aspect ratio is used are evaluated.

Example 2

A structure is set by stacking a SiO₂ substrate layer/a light-absorbing layer (a thickness: 200 nm)/a TiO₂ nanostructure array (a thickness: 275 nm) from the bottom. The light-absorbing layer is based on properties of the above near-infrared absorption film.
The TiO₂ nanostructure array is set to have the following periodic pattern of TiO₂ nanostructures.
  Shape: rectangular parallelepiped (or square)
  Shape of cross-section: square
  Width (w): 350 nm,
  Thickness (t): 275 nm,
  Period (p): 600 nm,
  Gap (g): 250 nm Comparative Example 3

The same structure as Example 2 is set except that the stacking structure is designed to have the SiO₂ substrate layer/the TiO₂ nanostructure array without the light-absorbing layer.

Comparative Example 4

The same structure as Example 2 is set except that the stacking structure is designed to have the SiO₂ substrate layer/the light-absorbing layer (a thickness: 275 nm) without the TiO₂ nanostructure array.
Evaluation
Optical properties of the structures according to Example 2 and Comparative Examples 3 and 4 are evaluated.
The results are shown in Table 2.

TABLE 2

|  | Example 2 | Comparative Example 3 | Comparative Example 4 |
|---|---|---|---|
| Light absorption rate (@ 937 nm) (%) | 73 | 0 | 25 |
| Transmittance (@ 937 nm) (%) | 11 | <2 | 72 |
| Reflectance (@ 937 nm) (%) | 16 | >98 | 3 |
| $\lambda_{min,\,T}$ (nm) | 896 | 890 | 937 |

Referring to Table 2, the structure according to Example 2 exhibits greatly high light absorption characteristics due to the complementary bonding of the nanostructure array and the light-absorbing layer compared with the structures according to Comparative Examples 3 and 4.

Design and Evaluation of Combination Structure III

The same structure as the above example is set except that average refractive index (n) is changed to 1.5 (@900 nm-1000 nm) and an average absorbance (k) is changed to 0.08 (@900 nm-1000 nm) in the physical properties of the near-infrared absorption film, and optical simulation of the combination structure including the nanostructure array and the light absorption portion is performed using FDTD (Finite-different time domain, Lumerical) software.

Example 3

The TiO$_2$ nanostructure array and the light absorption portion (a thickness: 275 nm) are disposed in a single layer, wherein a side surface of the TiO$_2$ nanostructure array is set to contact the light absorption portion. In other word, on the SiO$_2$ substrate layer, the side light absorption portion (a thickness: 275 nm) having the same thickness as that of the TiO$_2$ nanostructure array is set to have a stacked structure. The light absorption portion is based on properties of the above near-infrared absorption film.

The TiO$_2$ nanostructure array is set to have the following periodic pattern of TiO$_2$ nanostructures.
Shape: rectangular parallelepiped
Shape of cross-section: square
Width (w): 350 nm,
Thickness (t): 275 nm,
Period (p): 600 nm,
Gap (g): 250 nm Evaluation Optical properties of the structures according to Example 3 and Comparative Examples 3 and 4 are evaluated.

Figure 20:
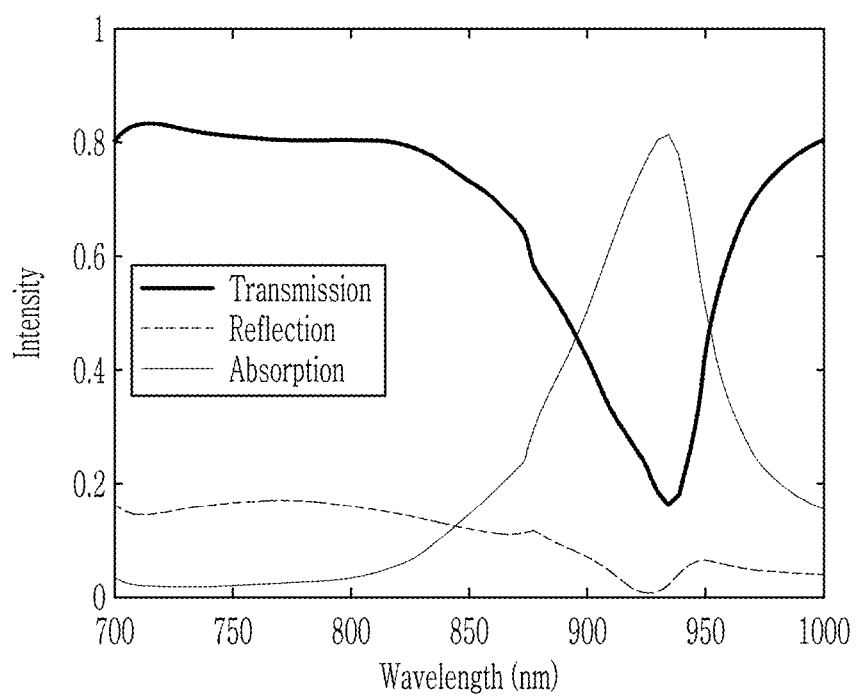
FIG. 20 is an optical spectrum of the structure according to Example 3.
Figure 21:
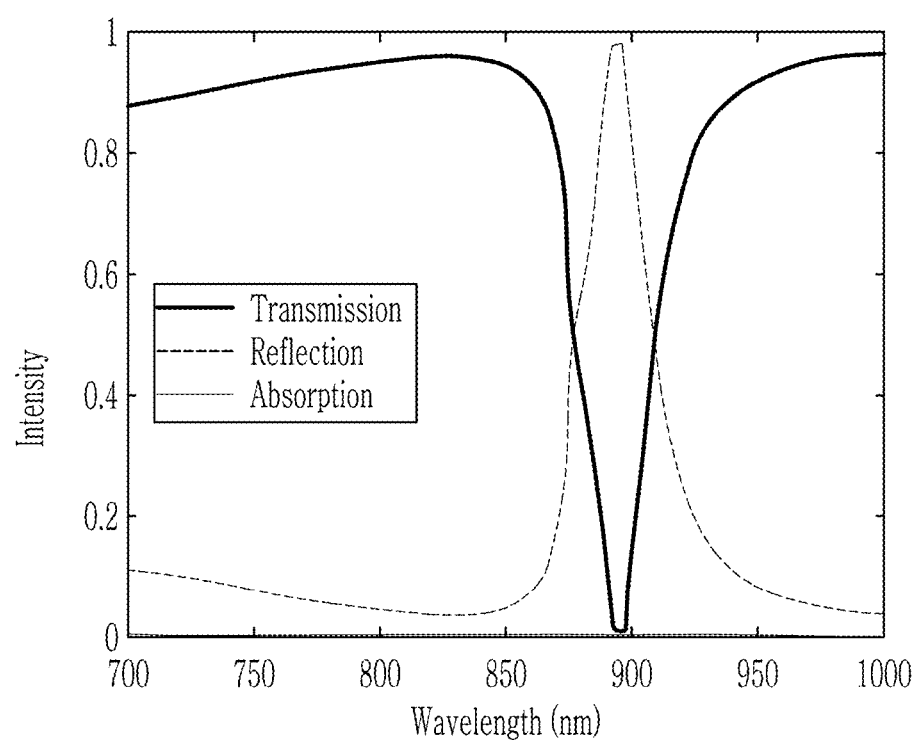
FIG. 21 is an optical spectrum of the structure according to Comparative Example 3.
Figure 22:
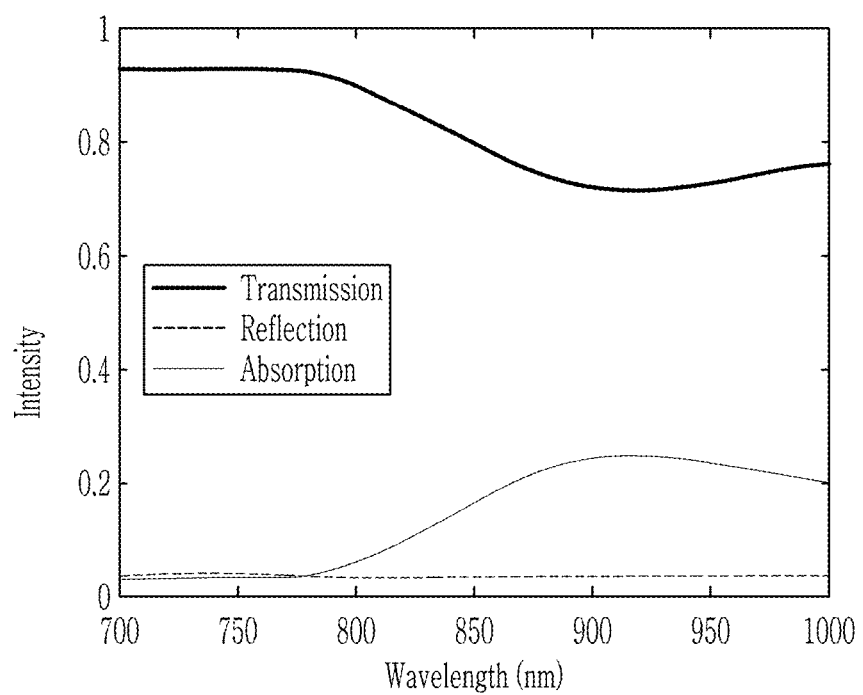
FIG. 22 is an optical spectrum of the structure according to Comparative Example 4.

The results are shown in Table 3 and FIGS. 20 to 22.

FIG. 20 is an optical spectrum of the structure according to Example 3, FIG. 21 is an optical spectrum of the structure according to Comparative Example 3, and FIG. 22 is an optical spectrum of the structure according to Comparative Example 4.

TABLE 3

|  | Example 3 | Comparative Example 3 | Comparative Example 4 |
| --- | --- | --- | --- |
| Light absorption rate (@$\lambda_{max, A}$) (%) | 82 | 0 | 25 |
| Transmittance (@$\lambda_{min, T}$) (%) | 16 | <2 | 72 |
| Reflectance (@$\lambda_{max, A}$) (%) | 2 | >98 | 3 |
| $\lambda_{max, A}, \lambda_{min, T}$ (nm) | 934 | 890 | 937 |

Referring to Table 3 and FIGS. 20 to 22, the structure of Example 3 exhibits greatly high light absorption characteristics due to the complementary bonding of the nanostructure array and the light-absorbing layer compared with the structures of Comparative Examples 3 and 4.

Design and Evaluation of Combination Structure IV

Based on the properties of the near-infrared absorption film, an optical simulation of the combination structure including the nanostructure array and the light absorption portion is performed using FDTD (Finite-different time domain, Lumerical) software.

Example 4

The Si nanostructure array and the light absorption portion (a thickness: 175 nm) are disposed in a single layer, wherein a side surface of the Si nanostructure array is designed to contact the light absorption portion. In other words, the SiO$_2$ substrate layer/the Si nanostructure array are set to have a stacked structure with the light absorption portion (a thickness: 175 nm)/SiO$_2$ (a thickness: 100 nm). The light absorption portion is based on properties of the aforementioned near-infrared absorption film.

The Si nanostructure array is set to have the following periodic pattern of the Si nanostructure (a refractive index: 4.09 @940 nm).
Shape: rectangular parallelepiped
Shape of cross-section: square
Width (w): 225 nm,
Thickness (t): 175 nm,
Period (p): 600 nm,
Gap (g): 375 nm Comparative Example 5

The same structure as that of Example 4 is set except that the Si nanostructure array is formed on the whole surface of the SiO$_2$ substrate layer without the light absorption portion.

Comparative Example 6

The same structure as that of Example 4 is set except that the light absorption portion (a thickness: 175 nm) is formed on the whole surface of the SiO$_2$ substrate layer without the Si nanostructure array.

Evaluation

Optical properties of the structures according to Example 4 and Comparative Examples 5 and 6 are evaluated.

Figure 23:
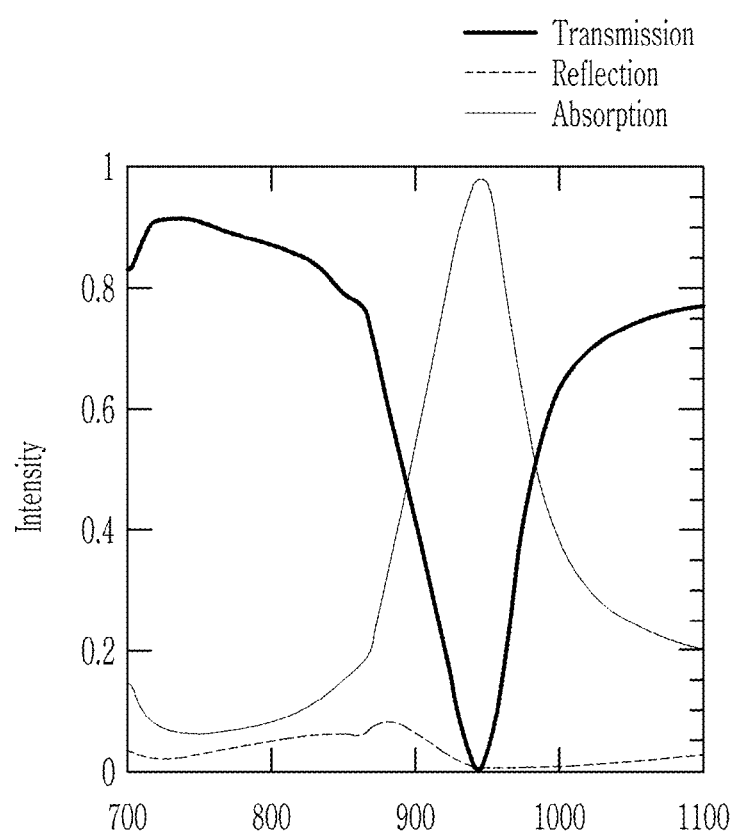
FIG. 23 is an optical spectrum of the structure according to Example 4.
Figure 24:
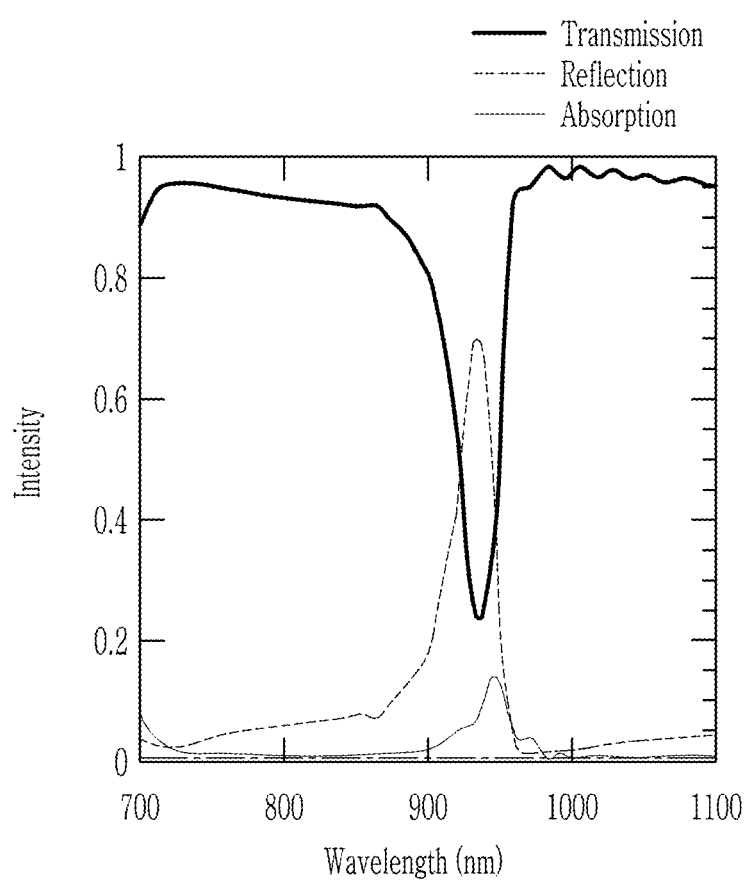
FIG. 24 is an optical spectrum of the structure according to Comparative Example 5.
Figure 25:
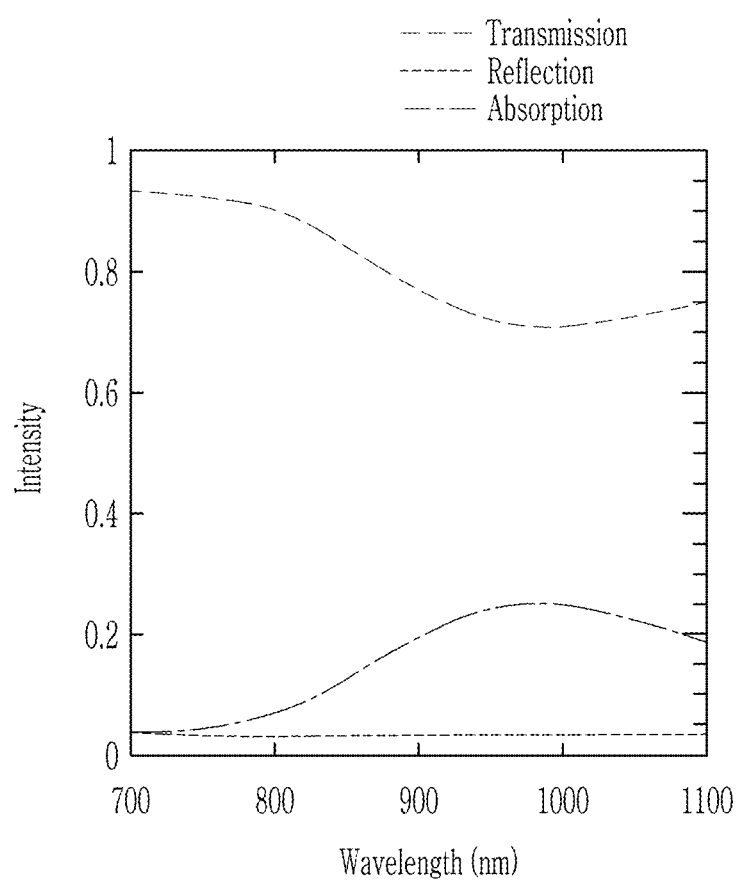
FIG. 25 is an optical spectrum of the structure according to Comparative Example 6.

The results are shown in Table 4 and FIGS. 23 to 25.

FIG. 23 is an optical spectrum of the structure according to Example 4, FIG. 24 is an optical spectrum of the structure according to Comparative Example 5, and FIG. 25 is an optical spectrum of the structure according to Comparative Example 6.

TABLE 4

|  | Example 4 | Comparative Example 5 | Comparative Example 6 |
| --- | --- | --- | --- |
| Light absorption rate (@$\lambda_{max, A}$) (%) | 98 | 8 | 21 |
| Transmittance (@$\lambda_{min, T}$) (%) | 1 | 23 | 76 |
| Reflectance (@$\lambda_{max, A}$) (%) | 1 | 69 | 3 |
| $\lambda_{max, A}, \lambda_{min, T}$ (nm) | 947 | 937 | 960 |

Referring to Table 4 and FIGS. 23 to 25, the structure according to Example 4 exhibits greatly high light absorption characteristics due to the complementary bonding of the nanostructure array and the light-absorbing layer compared with the structures according to Comparative Examples 5 and 6.

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:
1. A combination structure, comprising
a nanostructure array including a plurality of nanostructures, each of the plurality of nanostructures having a width smaller than a near-infrared wavelength and are repeatedly arranged, and
a light absorption portion adjacent to the nanostructure array, the light absorption portion including a near- infrared absorbing material configured to selectively absorb light in at least a portion of a near-infrared wavelength region.

2. The combination structure of claim 1, wherein the light absorption portion is on at least one of a lower, an upper, and a side of the plurality of nanostructures.

3. The combination structure of claim 1, wherein the plurality of nanostructures and the light absorption portion are in contact with each other.

4. The combination structure of claim 1, wherein the near-infrared wavelength is in a range of greater than about 700 nm and less than or equal to about 1200 nm.

5. The combination structure of claim 4, wherein the near-infrared wavelength is in a range of about 890 nm to about 990 nm.

6. The combination structure of claim 1, wherein
a width of the nanostructure is about 100 nm to about 500 nm, and
a thickness of the nanostructure is about 50 nm to about 500 nm.

7. The combination structure of claim 1, wherein each of the nanostructures of the plurality of nanostructures includes a high refractive material having a refractive index of greater than or equal to about 2.4 at 940 nm.

8. The combination structure of claim 7, wherein each of the nanostructures of the plurality of nanostructures includes a titanium oxide, silicon, aluminum, a III-V semiconductor compound, or a combination thereof.

9. The combination structure of claim 1, wherein the near-infrared absorbing material is configured to absorb light in at least a portion of a wavelength region of greater than about 700 nm and less than or equal to 1200 nm.

10. The combination structure of claim 9, wherein a maximum absorption wavelength of the near-infrared absorbing material is in a range of about 890 nm to about 990 nm.

11. The combination structure of claim 1, wherein a refractive index of the light absorption portion is lower than a refractive index of the nanostructure.

12. The combination structure of claim 11, wherein a refractive index of the light absorption portion at 940 nm is less than or equal to about 1.8.

13. The combination structure of claim 1, wherein the near-infrared absorbing material includes a quantum dot, a quinoid metal complex compound, a polymethine compound, a cyanine compound, a phthalocyanine compound, a merocyanine compound, a naphthalocyanine compound, an immonium compound, a diimmonium compound, a triarylmethane compound, a dipyrromethene compound, an anthraquinone compound, a diquinone compound, a naphthoquinone compound, a squarylium compound, a rylene compound, a perylene compound, a pyrylium compound, a squaraine compound, a thiopyrylium compound, a diketopyrrolopyrrole compound, a boron dipyrromethene compound, a nickel-dithiol complex compound, a croconium compound, a derivative thereof, or a combination thereof.

14. The combination structure of claim 1, wherein an optical spectrum of the combination structure has a maximum absorption wavelength in the wavelength region of greater than about 700 nm and less than or equal to 1200 nm, and
a light absorption rate at the maximum absorption wavelength is greater than about 50%.

15. The combination structure of claim 14, wherein the maximum absorption wavelength is in a range of about 890 nm to about 990 nm.

16. The combination structure of claim 1, wherein
an optical spectrum of the combination structure has a minimum transmission wavelength in a wavelength region of greater than about 700 nm and less than or equal to 1200 nm and
a transmittance at the minimum transmission wavelength is less than or equal to about 35%.

17. The combination structure of claim 16, wherein the minimum transmission wavelength is in a range of about 890 nm to about 990 nm.

18. The combination structure of claim 1, further comprising a substrate layer, and
a refractive index of the substrate layer is lower than a refractive index of the nanostructure.

19. The combination structure of claim 1, wherein a thickness of the combination structure is less than or equal to about 1 μm.

20. An optical filter comprising the combination structure of claim 1.

21. A camera module comprising the optical filter of claim 20.

22. An electronic device comprising the camera module of claim 21.

23. An electronic device comprising the optical filter of claim 20.

24. An image sensor comprising:
a semiconductor substrate including a plurality of photodiodes, and
an optical filter on the semiconductor substrate, the optical filter configured to block light in at least a portion of near-infrared wavelength regions,
wherein the optical filter includes the combination structure of claim 1.

25. The image sensor of claim 24, further comprising a color filter on the semiconductor substrate and on or under the optical filter.

26. The image sensor of claim 24, further comprising a dual band pass filter configured to transmit all visible wavelength regions and a portion of the near-infrared wavelength region.

27. A camera module comprising the image sensor of claim 24.

28. An electronic device comprising the image sensor of claim 27.

* * * * *